US005738936A

United States Patent [19]
Hanrahan

[11] Patent Number: 5,738,936
[45] Date of Patent: Apr. 14, 1998

[54] THERMALLY CONDUCTIVE POLYTETRAFLUOROETHYLENE ARTICLE

[75] Inventor: James R. Hanrahan, Newark, Del.

[73] Assignee: W. L. Gore & Associates, Inc., Newark, Del.

[21] Appl. No.: 671,560

[22] Filed: Jun. 27, 1996

[51] Int. Cl.$^6$ .............................. B32B 5/18; B32B 25/02; B32B 27/20; B32B 27/34

[52] U.S. Cl. .................. 428/313.5; 428/317.9; 428/319.3; 428/324; 428/325; 428/327; 428/328; 428/329; 428/330; 428/331; 428/402.21; 428/403; 428/404; 428/406; 428/421; 428/422; 428/901; 257/706; 257/720; 361/709

[58] Field of Search .................... 428/195, 206, 428/208, 323, 324, 325, 327, 328, 329, 330, 331, 421, 422, 304.4, 306.6, 308.4, 313.3, 313.4, 313.5, 314.4, 315.5, 317.9, 318.4, 319.3, 402.21, 403, 404, 406, 901; 257/705, 720; 361/709; 438/122; 439/487

[56] References Cited

U.S. PATENT DOCUMENTS

| | | | |
|---|---|---|---|
| 3,953,566 | 4/1976 | Gore | 264/288 |
| 4,008,300 | 2/1977 | Pomm | 264/104 |
| 4,265,775 | 5/1981 | Aakalu et al. | 252/573 |
| 4,385,093 | 5/1983 | Hubis | 428/316.6 |
| 4,518,737 | 5/1985 | Traut | 524/413 |

(List continued on next page.)

FOREIGN PATENT DOCUMENTS

| | | |
|---|---|---|
| 0322165 | 6/1989 | European Pat. Off. |
| 0 535 471 A1 | 4/1993 | European Pat. Off. |
| 51-26940 | 3/1976 | Japan |
| 54-125499 | 9/1979 | Japan |
| 54-156068 | 12/1979 | Japan |
| 59-159225 | 7/1984 | Japan |
| 60-237437 | 10/1985 | Japan |
| 1012406 | 1/1989 | Japan |
| 3137138 | 6/1991 | Japan |
| 2 195 269 | 6/1987 | United Kingdom |
| 2219133 | 11/1989 | United Kingdom |

OTHER PUBLICATIONS

IBM Technical Disclosure Bulletin; "Thermally Conductive, Removable, Elastomeric Interposer for Chip–to–Heat Sink Attachment"; vol. 35, No. 7, Dec. 1992, pp. 241–242.

"Thermal Gap Filters", Electronic Packaging and Production, vol. 33 No. 8, Aug. 1993, p. 55.

Data Sheet: "Adhesive Interconnect Systems 5303R Z–Axis Adhesive Film (ZAF); 3m: Jan. 5, 1993, Revis. 002 Effective Polymer Adhesives For Interconnect" by Kreutter, et al.; 3M; Date: Unknown.

(List continued on next page.)

Primary Examiner—Paul J. Thibodeau
Assistant Examiner—Vivian Chen
Attorney, Agent, or Firm—Victor M. Genco, Jr.

[57] ABSTRACT

A thermally conductive article comprises a polytetrafluoroethylene matrix, an elastomer interpenetrating the polytetrafluoroethylene matrix, thermally conductive particles, and expanded polymeric particles. The thermally conductive article is compressible and has good thermal conductivity under compression.

11 Claims, 2 Drawing Sheets

U.S. PATENT DOCUMENTS

| | | | |
|---|---|---|---|
| 4,557,957 | 12/1985 | Manniso | 428/36 |
| 4,574,879 | 3/1986 | DeGree et al. | 165/185 |
| 4,598,011 | 7/1986 | Bowman | 428/221 |
| 4,602,678 | 7/1986 | Fick | 165/79 |
| 4,606,962 | 8/1986 | Reylek et al. | 428/148 |
| 4,669,954 | 6/1987 | Habarou et al. | 415/174 |
| 4,810,563 | 3/1989 | DeGree et al. | 428/209 |
| 4,820,376 | 4/1989 | Lambert et al. | 156/643 |
| 4,853,763 | 8/1989 | DeGree et al. | 357/81 |
| 4,902,857 | 2/1990 | Cranston et al. | 174/94 |
| 4,960,612 | 10/1990 | Dentini et al. | 427/47 |
| 4,961,064 | 10/1990 | Hara | 338/231 |
| 4,985,296 | 1/1991 | Mortier, Jr. | 428/220 |
| 4,996,097 | 2/1991 | Fischer | 428/220 |
| 4,999,741 | 3/1991 | Tyler | 361/387 |
| 5,001,302 | 3/1991 | Atsumi | 174/94 |
| 5,011,872 | 4/1991 | Latham et al. | 523/440 |
| 5,028,984 | 7/1991 | Ameen et al. | 357/72 |
| 5,045,249 | 9/1991 | Jin et al. | 264/24 |
| 5,060,114 | 10/1991 | Feinberg et al. | 361/387 |
| 5,084,211 | 1/1992 | Kawaquchi et al. | 252/511 |
| 5,137,283 | 8/1992 | Giarrusso et al. | 277/1 |
| 5,209,967 | 5/1993 | Wright et al. | 428/283 |
| 5,213,868 | 5/1993 | Liberty et al. | 428/131 |
| 5,227,230 | 7/1993 | McGlade | 428/319.1 |
| 5,328,756 | 7/1994 | Wright et al. | 428/220 |
| 5,429,869 | 7/1995 | McGregor et al. | 428/364 |
| 5,431,571 | 7/1995 | Hanrahan et al. | 439/91 |

OTHER PUBLICATIONS

Nuggets Uniteck Equipment Technical Services Bulletin 920A; Unitek Equipment, Inc., 3M Anisotropic (Conductive) Adhesive.

Article: Z–Axis Adhesive Film: Innovation in Electronic Interconnection; Bruce Grove; InterConnection Technology, Dec. 1992.

"Portable Electronics Packaging Project"; Microelectronics and Computer Technology Corporation; Bert Haskell; Sep. 1992.

"Interconnection Method of Liquid Crystal Driver LSIs by Tab–On–Glass and Board to Glass Using Anisotropi Conductive Film and Monosotropic Heat Seal Connectors"; Roger R. Reinke, Elform, Incorporated; pp. 1–7.

"Prediction and Measurement of Thermal Conductivity of Diamond Filled Adhesives" by Justin C. Bolger, Emerson & Cuming, Inc.; pp. 219–224; 1992.

Cho–Therm(r) Thermal Interface Materials; Grace Company; Date: Unknown.

"Silicones with Improved Thermal Conductivity for Thermal Conductivity for Thermal Management in Electronic Packaging"; Adam L. Peterson; Dow Corning Corporation; pp. 613–619; Date: Unknown.

"Sil–Pad(r) Design Guide"; The Bergquist Company; Date: Spring, 1993; pp. 1–23.

"Elastomeric Connector User design Card"; PCK Elastomerics, Inc.; Date: Unknown.

Patent Application 08/573,339, Hanrahan et al., filed Dec. 15, 1995.

THERMALLY CONDUCTIVE POLYTETRAFLUOROETHYLENE ARTICLE

FIELD OF THE INVENTION

The present invention generally relates to an improved, thermally conductive polytetrafluoroethylene article.

BACKGROUND OF THE INVENTION

Integrated circuit ("IC") chips are steadily becoming smaller and more powerful. When compared to previous integrated circuit chips, this trend produces integrated chips which are significantly more dense and which perform many more functions in a given period of time. This results in an increase in the electrical current used by these integrated circuit chips. Consequently, smaller and more powerful integrated circuit chips tend to generate significantly more heat than larger and less powerful IC chips. Accordingly, heat management in electronic products has become a chief concern in IC chip design.

Reliability of electronic circuits is dependent upon proper matches in the coefficients of expansion of various electronic components. As the temperature rises, mismatches in the coefficients of expansion cause stresses to develop between electronic components. Under these circumstances, any increase in operating temperature will have a negative effect on reliability. In an effort to control heat better, the use of various heat sinks is now a central focus in electronic equipment design. Examples of common heat sinks employed today include: IBM Thermal Conductive Modules (ITCM); Mitsubishi High Thermal Conduction Modules (HTCM); Hitachi SiC Heat Sinks; Fujitsu FACOM VP2000 Cooling Mechanisms; or metal plates of copper, aluminum, for example.

In order to mate IC chips to heat sinks successfully, an interface which is elastic or otherwise conformable is preferred so as to ease installation and to minimize the effect of expansion and contraction between electronic components. Air gaps formed from improper installation of a chip to a heat sink, and/or expansion and contraction cycles during operation, can greatly impede the flow of heat from an IC chip. Conformability becomes especially important when the tolerances on the heat sink and chip tilt (in the case of flip chips) become large.

Typically, thermal greases or thermally conductive thermosetting materials are used to take up tolerances between electronic components. See, e.g., U.S. Pat. No. 5,028,984. While such materials may operate with varying degrees of success in some applications, they are replete with shortcomings which detract from their usefulness. For example, these materials tend to be difficult to control and are prone to contaminating components of the electronic device. Care must be taken when using these materials to prevent unwanted contamination of solder joints and, in the case of electrically conductive thermoset resins, unwanted contamination of adjacent conductors. In practice, this usually results in a significant amount of wasted material. Additionally, clean up of such materials often requires the use of solvents.

In U.S. Pat. No. 5,187,283, a gasket-type material is disclosed comprising a thin-film surrounding a meltable metal core. In operation, the gasket is installed as an interface and its temperature is increased to melt the metal core and allow it to conform to the component parts. Unfortunately, this construction is believed to be ineffective in avoiding air gaps that can form during normal thermal cycling of the device. Further, as is a common problem with solid gasket materials in general, it is believed that this device may experience limited compressibility, requiring either application of excessive pressure to the mating surfaces, or use of unacceptably thick sections of the gasket.

In U.S. Pat. No. 5,060,114, conformability is sought by curing a metal or metal oxide filled silicone around the component to be cooled. Although this method may be successful, it is believed to be unduly complicated, costly, and time consuming for practical widespread use.

In addition to the foregoing, with most thermoset resins, greases, and gaskets employing a filler, there are additional constraints in successful heat dissipation. Most resins or greases tend to coat each individual particle of the thermal conductor within the resin, essentially insulating the conductor. This greatly reduces the overall effective thermal conductivity of the product in at least two ways. First, even a thinly coated surface (e.g., with a layer of silicone or epoxy) can serve as a thermal insulator, reducing the effective thermal conductivity of the product, particularly at contacting surfaces. Second, in order to overcome such thermal insulation, it is often necessary to apply substantial pressure to the interface in order to urge the thermally conductive particles into direct contact with one another to produce the necessary amount of conduction through the material. This often requires unacceptable compressive force for integrated circuits to produce a viable thermally conductive interface.

As a result, most commercially available products can produce a conductivity in the range of only about 1.8 W/M °K (for greases) to 2.2 W/M °K (for epoxies). Even the most advanced (and expensive) materials, such as silver filled epoxies, only can achieve a conductivity in the range of 3–4 W/M °K. With regard to easily handled materials, such as self-adhesive materials, (available from Chomerics, Inc., Woburn, Mass., under the trademark CHO-THERM Thermal Interface Materials, and from The Bergquist Company, Minneapolis, Minn., under the trademark SIL-PAD Thermal Management Materials) these can typically achieve a conductivity of only about 0.37–0.95 W/M °K and 0.6–1.5 W/M °K, respectively. Although these commercial materials can produce better conductivities at high mounting pressures, they deliver extremely poor conductivity at very low mounting pressures (e.g., pressures below 2–3 lbs/in$^2$).

Various other materials have been developed for use in electrical circuit boards, such as materials comprised of polytetrafluoroethylene (PTFE), and in many cases, porous PTFE as is taught in U.S. Pat. No. 3,543,566. U.S. Pat. No. 4,985,296 teaches the use of a PTFE material highly filled with inorganic filler that is between 0.1 and 5.0 mil thick and substantially pin hole free. This material is particularly suitable for use as an electrically or thermally conductive layer in printed circuit boards and the like. However, the process of producing this material requires densification of the membrane, significantly reducing its conformability. U.S. Pat. No. 4,996,097 teaches similar technology useful for a thin capacitive layer in a printed wiring board (PWB). U.S. Pat. No. 4,518,737 teaches an extruded composite tape of ceramic filler and PTFE useful for its high dielectric constant. Such composites have not gained widespread acceptance because of the difficult processing techniques associated with their use. This can be very inconvenient, and often impossible to accomplish, especially for many adhesive applications where materials being bonded cannot withstand the necessary temperatures and pressures.

Japanese laid-open patent application 61-40328 teaches impregnating a silicone rubber imbibed within a porous expanded PTFE structure for use as a thin electrical insulator with thickness no greater than 50 mm. A solution of silicone rubber is imbibed into the porous structure of expanded PTFE, which renders the product transparent (free of filler). The final product is then cured. In an attempt to reinforce this structure, Japanese laid-open patent 62-100539, teaches a silicone rubber article which is made by first incorporating a ceramic into a dispersion of PTFE, thus collecting the filler at the nodes of the node-and-fibril structure, then imbibing the silicone resin into said fibrillated structure as described above. In both of these instances, the final product is a rubber-like cured sheet.

In a similar fashion, British patent 2,195,269B (EP-0248617B1), describes an article and process of imbibing expanded PTFE with a thermosetting resin which is useful as an substrate for a PWB. Unfortunately, previous attempts at this approach have been largely unsuccessful because high degrees of ceramic loading with the addition of ceramic filler tends to weaken the node and fibril structure.

Other problems experienced by many commercially available filled thermoset resins include: inadequate conformability (i.e., excessive compressive force required to get higher thermal conductivity); high flexural modulus after curing—resulting in substantial stress upon devices during thermal cycling; a lack of "compliance"—resulting in stress fractures if the resin is flexed longitudinally after curing; long curing times; and difficulty in manufacturing in high volumes.

The foregoing illustrates limitations known to exist in present thermally conductive articles. Thus, it is apparent that it would be advantageous to provide an improved thermally conductive article directed to overcoming one or more of the limitations set forth above. It would be desirable if such an improved thermally conductive article is compressible, by as much as 100 mils, under a low load, such as less than 50 pounds per square inch (PSI). Accordingly, a suitable alternative is provided including features more fully disclosed hereinafter.

SUMMARY OF THE INVENTION

The present invention relates to a thermally conductive composite article obtained from a predetermined precursor material. The thermally conductive composite article has a polytetrafluoroethylene matrix and comprises thermally conductive particles, and energy expandable hollow polymeric particles. In one embodiment of the present invention, the volume percent of the thermally conductive particles is at least 20 volume percent of the precursor material.

The volume percent of the energy expanded hollow polymeric particles may be in a range from about 1 to about 15 volume percent of the precursor material. Preferred thermally conductive particles include, but are not limited to the following: metals, such as aluminum (Al), copper (Cu), nickel (Ni), silver (Ag), or Zinc (Zn); metal bead; metal powder; metal fiber; metal coated fiber; metal flake; metal coated metals; metal coated ceramics; metal coated glass bubbles; metal coated glass beads; metal coated mica flakes; or other thermally conductive particles, which may also be electrically non-conductive, such as zinc oxide, aluminum oxide, boron nitride (BN), aluminum nitride (AlN), diamond powder, or silicon carbide (SiC).

The thermally conductive composite article may include an elastomer material disposed within the composite article in a discontinuous fashion. Suitable elastomer materials include but are not limited to: silicone, polyurethane, ethylenepropylene, fluorosilicone, fluorocarbon elastomers, perfluoro elastomers, or other fluoroelastomer materials.

It is, therefore, a purpose of the present invention to provide an improved, thermally conductive polytetrafluoroethylene article for use in a variety of applications.

It is also a purpose of the present invention to provide an improved thermally conductive material for use as a thermally conductive gasket or interface.

It is another purpose of the present invention to provide an improved, thermally conductive polytetrafluoroethylene material that is both soft and easily compressible, (e.g., a thermally conductive polytetrafluoroethylene material having a Shore A hardness of less than about 35 with the ability to compress at least 30% at 100 PSI) for use in a variety of applications requiring a flexible, conformable, and thermally conductive material throughout the structure of the article.

BRIEF DESCRIPTION OF THE DRAWINGS

The foregoing summary, as well as the following detailed description of a preferred embodiment of the present invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings.

DETAILED DESCRIPTION OF THE INVENTION

Figure 1:
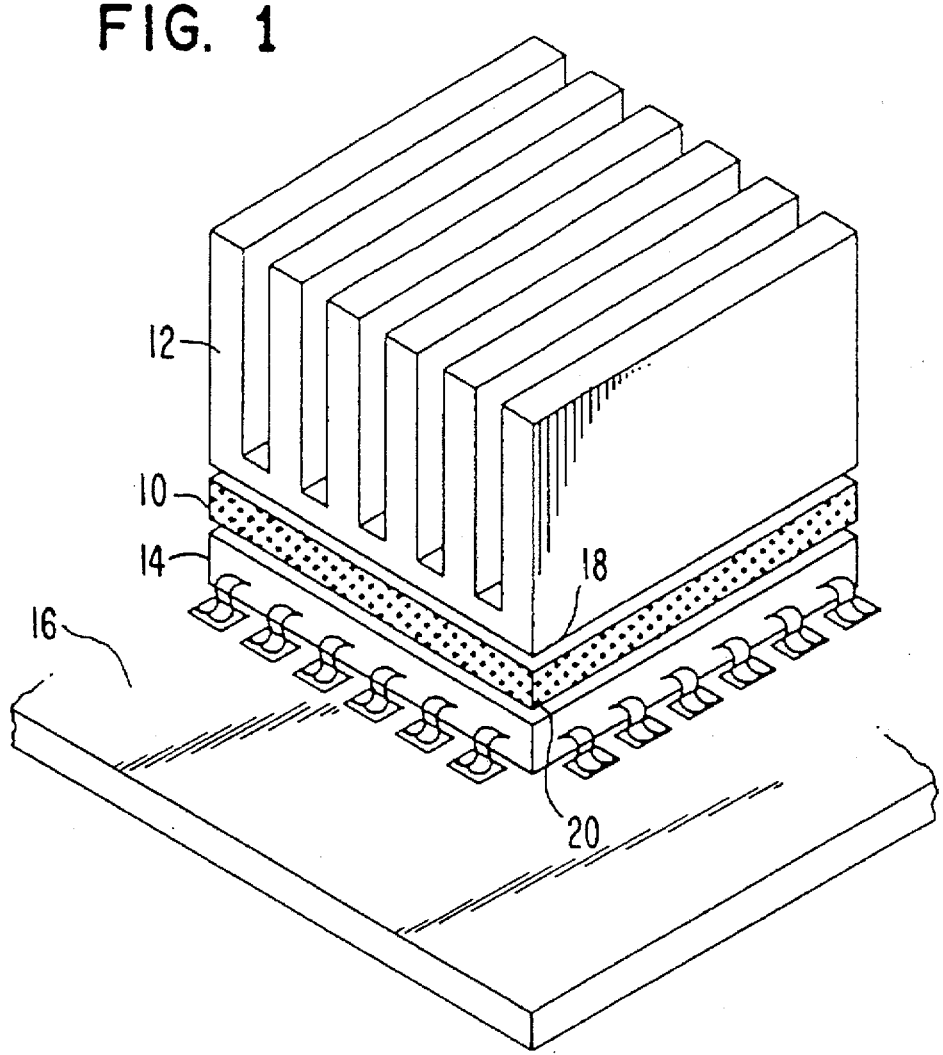
FIG. 1 is a three-quarter isometric view of one embodiment of a thermally conductive article of the present invention shown mounted between component parts of an electronic device.

Shown in FIG. 1 is a thermally conductive interface 10 in accordance with the teachings of one embodiment of the present invention. The thermally conductive interface 10 is mounted between two representative components, a heat sink 12 and a integrated circuit 14, on an electronic circuit board 16. Although heat sink 12 is illustrated comprising a base portion and fins, any suitable heat sink is contemplated by the teachings herein, such as a metallic block or plate, for example. Unlike many presently available thermally conductive interfaces, an interface made in accordance with the present invention provides exceptional conformability between component parts. As a result, with minimal compressive pressure, the interface 10 forms a tight connection between the interface 10 and abutting surfaces 18, 20 of each of the components with little or no air spaces present to disrupt thermal conductivity.

As the term "tight" is used to describe the connection achieved between component parts using the interface of the present invention, it is meant to encompass a junction between component parts whereby the interface material has conformed to fill in irregularities in the surfaces of the component parts and significantly reduce or eliminate any air spaces therebetween. An interface made in accordance with the teachings of the present invention is particularly effective at establishing a tight connection at relatively low mounting pressures. As the term "low mounting pressures" is used in this application, it is intended to encompass the restricted pressures that sensitive electronic products (e.g., silica IC chips) can withstand, and includes pressure below about 30 lb/in$^2$ (147 kg/m$^2$).

Figure 2:
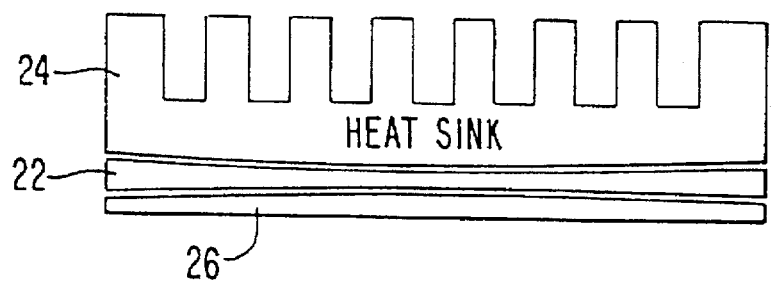
FIG. 2 is a cross-sectional view of another embodiment of a thermally conductive article of the present invention shown mounted between two component parts of an electronic device.

The interface 10 of the present invention can be formed in a variety of shapes and sizes to fill particular needs. Shown in FIG. 2 is another embodiment of a thermally conductive interface 22 made in accordance with the teachings of the present invention. In this instance, the interface 22 is deformed to provide a compliant connection between a heat sink 24 and an electronic component 26.

In the present invention, a thermally conductive polytetrafluoroethylene (PTFE) article is provided comprising energy expandable particulate blended with PTFE and thermally conductive particles. The PTFE article of the present invention is thermally conductive and easily compressed. Such a material may be effectively employed in a variety of useful applications, including but not limited to, the following: use as a thermal interface between an electronic device, or multiple devices, or a heat sink to aid in cooling of suitable device(s).

The expandable particulate useful in the present invention exhibits intumescence upon application of heat. The expandable particulate is not homogeneous, i.e. it is not a polymeric bead, but rather comprises a polymeric shell having a central core comprised of a fluid material. A further characteristic is that the overall dimensions of the expandable particulate increase upon heating at a specific temperature.

Expandable hollow polymeric particulate useful in a precursor composite material of the present invention includes those materials comprised of a polymeric shell and a core of at least one other material, either liquid or gaseous, most preferably a liquid at room temperature, in which the polymeric shell is essentially insoluble. A liquid core is advantageous because the degree of expansion is directly related to the volume change of the core material at the expansion temperature. For a gaseous core material, the volume expansion expected can be approximated from the general gas laws. However, expandable particulate comprising a liquid core material offers the opportunity to provide much larger volume changes, especially in those cases where a phase change takes place (i.e., the liquid volatilizes at or near the expansion temperature).

Preferred expandable polymeric particulate (also called microspheres, microballoons, and microbubbles) useful in the precursor composite can have shells comprising copolymers such as vinyl chloride and vinylidene chloride, copolymers of vinyl chloride and acrylonitrile, copolymers of vinylidene chloride and acrylonitrile, copolymers of methacrylonitrile and acrylonitrile, and copolymers of styrene and acrylonitrile. Further can be mentioned are copolymers of methyl methacrylate containing up to about 2 percent by weight of styrene, copolymers of methyl methacrylate and up to about 50 percent by weight of ethyl methacrylate, and copolymers of methyl methacrylate and up to about 70 percent by weight of orthochlorostyrene. The unexpanded microspheres contain fluid, preferably volatile liquid, i.e., a blowing agent, which is conventional for microspheres of the type described here. Suitably, the blowing agent is 5 to 30 percent by weight of the microsphere. The microspheres can be added in different manners, as dried particles, wet cakes, or in a suspension, e.g. in an alcohol such as isopropanol.

Unexpanded particulate desirably is in the size range of from about 0.1 micrometer to about 600 micrometers, preferably from 0.5 micrometer to 200 micrometers, and most preferably from 1 micrometer to 100 micrometers. Expanded particulate can have a size in the range of from about 0.12 micrometer to 1000 micrometers, preferably from 1 micrometer to 600 micrometers. After expansion, the volume of the expandable particulate increases by a factor of at least 1.5, preferably by a factor of at least 5, and most preferably by a factor of at least 10, and may even be as high as a factor of about 100.

Suitable microspheres are commercially available from Nobel Industries of Sundsvall, Sweden, under the trademark EXPANCEL®. These microspheres may be obtained in a variety of sizes and forms, with expansion temperatures generally ranging from 80° to 130° C. A typical EXPANCEL microsphere has an initial average diameter of 9 to 17 micrometers and an average expanded diameter of 40 to 60 micrometers. According to Nobel Industries, the microspheres have an unexpanded true density of 1250–1300 kg/m$^3$, and an expanded density below 20 kg/m$^3$.

It should be understood that the use of the term "energy expandable particulate" herein is intended to encompass any hollow resilient container filled with volatile fluid which is adapted to expand. Although presently available microspheres are essentially ball-shaped particles adapted to expand when exposed to an energy source, it should be understood that such microspheres are quite resilient in their expanded form and can be compressed and released (e.g. through extrusion) to achieve the expansion required for the present invention. Additionally, it may be possible to form such products in a variety of other shapes, such as tubes, ellipsoids, cubes, particles, etc. As such, the term "energy expandable particulate" in the context of the present invention is intended to include all applicable forms and uses of these products now known or later developed.

A wide variety of blowing or raising agents may be enclosed within the polymeric shell of the expandable microspheres. They can be volatile fluid-forming agents such as aliphatic hydrocarbons including ethane, ethylene, propane, butane, isobutane, isopentane, neopentane, acetylene, hexane, heptane, or mixtures of one or more such aliphatic hydrocarbons, preferably having a number average molecular weight of at least 26, and a boiling point at atmospheric pressure about the same temperature range or below the range of the softening point of the resinous material of the polymeric shell when saturated with the particular blowing agent utilized.

In one presently preferred embodiment of the present invention, EXPANCEL type 091 DU microspheres are employed. This product comprises an off-white dry powder with a particle size ranging between 10 and 40 micrometers. The shell of these microspheres comprise acrylonitrile. The volatile liquid comprises isopentane.

It has been found that by mixing a dry preparation of EXPANCEL microspheres with a dispersion of PTFE, or similar polymer, and then heating the resulting composition, the polymer will undergo expansion in three-dimensions to achieve a fibrillated PTFE matrix.

In accordance with the present invention, a precursor material comprised of: thermally conductive particulate; PTFE, in the form of paste, dispersion or powder; and microspheres, in the form of a dry powder or solution, is mixed in proportions of at least 20 to 90 volume percent thermally conductive particulate, 1 to 15 volume percent EXPANCEL microspheres, and 5 to 70 volume percent PTFE, with proportions of 70 volume percent thermally conductive particulate, 3 volume percent EXPANCEL microspheres and 27 volume percent PTFE being preferred in an embodiment comprising at least in part thermally conductive flakes. Mixture may occur by any suitable means, including dry blending of powders, wet blending, co-coagulation of aqueous dispersions and slurry filler, high shear mixing, etc. As the term is used herein, "volume percent" shall mean a percentage of the volume of the precursor material.

Thermally conductive particulate enmeshed within the resulting PTFE precursor material is the major component thereof. Preferred thermally conductive particles include, but are not limited to the following: metals, such as aluminum (Al), copper (Cu), nickel (Ni), silver (Ag), or Zinc (Zn); metal bead; metal powder; metal fiber; metal coated fiber; metal flake; metal coated metals; metal coated ceramics; metal coated glass bubbles; metal coated glass beads; metal coated mica flakes; or other thermally conductive particles, which may also be electrically non-conductive, such as zinc oxide, aluminum oxide, boron nitride (BN), aluminum nitride (AlN), diamond powder, or silicon carbide (SiC). Additionally, a combination of two or more particulates can be used. Average size of the conductive flakes can be from about 1 µm to about 700 µm, preferably from about 50 µm to about 500 µm, and most preferably from about 100 µm to about 300 µm. Average size for conductive powders can be from about 0.5 µm to about 400 µm, preferably from about 0.5 µm to about 100µ, and most preferably from about 2 µm to about 60 µm.

The PTFE aqueous dispersion employed in producing the PTFE precursor of the present invention may be a milky-white aqueous suspension of PTFE particles. Typically, the PTFE aqueous dispersion will contain about 20% to about 70% by weight solids, the major portion of such solids being PTFE particles having a particle size in the range of from 0.05 micrometers to about 5.0 micrometers. Such PTFE aqueous dispersions are presently commercially available from the E. I. dupont de Nemours & Company, Inc., for example, under the tradename TEFLON® 3636, which is 18–24% by weight solids, being for the most part PTFE particles of about 0.05 micrometers to about 5.0 micrometers.

A thickness of the above described precursor material may range from about 3 mils to about 150 mils, for example.

Upon heating the precursor material, thickness increases due to the expansion of the energy expandable particulate. The amount of expansion observed is dependent on several factors, including the weight percent of energy expandable particulate present, the type of energy expandable particulate, the molecular weight of the polymeric shell of the energy expandable particulate, and the toughness of the PTFE matrix holding the precursor material together. An advantage of this process is the ability to produce thicknesses of greater than 250 mils after the expansion process.

Temperatures needed for the thermal expansion step to occur are dependent on the type of polymer comprising the shell of the microsphere and on the particular blowing agent used. Typical temperatures range from about 40° C. to about 220° C., preferably from 60° C. to 200° C., most preferably from 80° C. to 190° C.

In addition to the composite article which has been described above, an alternate embodiment of the present invention may be made by adding an elastomer material, such as a silicone elastomer material (e.g. dimethyl siloxane) to the precursor material. In one embodiment of the present invention, this is achieved by compounding the filled fine powder coagulum with the dimethyl siloxane. A suitable dimethyl siloxane is Sylgard® type 1-4105, or Q1-4010, which may be obtained from Dow Corning. [It may also be suitable to use a silicone dioxide reinforced silicone material such as Q3-661 which may also be obtained from Dow Corning.] The siloxane is added on a weight per weight basis, and may be diluted with a solvent, such as mineral spirits, for example. In general, the siloxane may be added in amounts ranging from 1 to about 50 percent, preferably from 5 to about 20 percent, and most preferably from 10 to about 15 percent. Other suitable elastomer materials include but are not limited to: silicone, polyurethane, ethylene/propylene, fluorosilicone, fluorocarbon elastomers, perfluoro elastomers, or other fluoroelastomer materials.

Subsequently, this precursor material is heated in a range from about 130° C. to about 190° C., to not only achieve expansion of the precursor material, but also to cross-link the siloxane and obtain a cured state of solid silicone elastomer. The resulting article is an easily compressible, thermally conductive PTFE composite, including a silicone elastomer disposed within the composite article in a discontinuous fashion.

The addition of the elastomer material yields a composite with increased z-strength, tensile strength and elongation. It also provides some degree of resilience and increases the usable temperature range of the material. These desired properties are achieved without sacrificing softness/compressibility of the composite article.

The following procedures were used to determine the properties of the materials created in the following examples.

Percent Compression

The expanded samples were measured for percent compression at 100 PSI per ASTM F36-88.

Density

The density of the precursor material was obtained by using a 1"×6" template to cut a sample exactly 1"×6". The sample was then weighed to the nearest 0.01 grams and the density calculated as follows:

$$D(g/cc) = \frac{M}{V};$$

where

M=Mass of sample to nearest 0.01 grams

V=Volume (Length×width×thickness).

Additionally, the expanded composite material was also measured in the manner described. The term % expansion will denote the % change in density of the sample in accordance with the following:

$$\% \text{ Expansion} = \frac{\text{density initial} - \text{density final}}{\text{density initial}} \times 100$$

Procedure for Measuring Thermal Conductivity

Samples are cut to 2.25 inch squares. The test device consists of two copper blocks. The top block is heated and insulated. The bottom block is cooled by circulating water. The test device sits inside a frame that allows constant pressure to be applied to the test device. The test device was designed similarly to the device described in ASTM 5470-93, Standard Test Method for Thermal Transmission Properties of Thin Thermally Conductive Solid Electrical Insulation Materials.

The hot block is heated with a given amount of power. The temperature drop down the hot block is monitored in two places with four thermocouples. The temperature at the hot surface is approximated by thermocouples that are mounted 0.031 inches away from the surface. The temperature at the test specimen surface is the average of the four thermocouple readings. The cold block is identical in design and thermocouple placement.

Prior to mounting the specimen, the thickness is measured. The specimen is mounted on the bottom cold block. The top hot block is placed over the specimen. A given pressure is applied. The test consists of measuring the temperature drop across the test specimen as a function of the power supplied. Thermal resistance is calculated by dividing the temperature difference across the sample by the power supplied. The units are °C./W. Thermal conductivity is calculated by using Fourier's conduction equation:

$$k = \frac{Q \times t}{A \times \Delta T}$$

where k=thermal conductivity, W/m°C.

Q=power, W t=sample thickness, m

A=sample area, m$^2$ $\Delta T$=temperature drop across sample, °C.

Temperature readings are taken every one half hour until equilibrium is reached.

The thermally conductive interface of the present invention is particularly designed for the dissipation of heat energy from component parts of electronic devices, such as power FET, computer logic circuits, and other high electronic density circuits. It should be understood, however, that applications of the present invention may include a wide selection of other uses, such as, but not limited to: power transformers, transistor packages (such as those designated TO-3, TO-5, TO-18, TO-36, TO-66, TO-220, etc.) and diode packages (such as those designated DO-4, DO-5, etc.).

It should be likewise understood that without departing from the present invention the thermally conductive properties of the present invention may also be employed in the transference of heat to certain component parts, such as heat sinks, cold plates, and the like.

Without intending to limit the scope of the present invention, the following examples illustrate how the present invention may be made and used.

EXAMPLE 1

145.6 g of boron nitride (type HCJ-48 from Advanced Ceramics, Inc.) and 5.2 g EXPENCEL type 091DU microspheres were slurried in a 1,643 g of diionized water. The slurry was then coagulated with 206.7 g of PTFE dispersion (type TE3636 obtained from E. I. dePont de Nemours & Company, Inc.). The coagulum was then dried at 90° C. for 16 hours, frozen at −10° C. for 24 hours and hand screened through a ¼" mesh metal screen. The resulting powder was lubricated at a level of 0.35 lbs. lubricant per pound of coagulum. The lubricant consisted of a mixture comprising 75% by weight silicone elastomer (Sylgard® type 1-4105 obtained from Dow Corning) and 25% by weight mineral spirits. The resulting material was allowed to dwell at room temperature (≈72° F.) for 24 hours, then preformed into a 1" diameter pellet and extruded into a tape approximately 44 mils thick and 2" wide. The tape was then calandered to a thickness of 7 mils. A sample of this extrudate was then cured at 100° C. for 5 minutes. See FIG. 3 for a cross-sectional photomicrograph. This step is necessary to cure the silicone and remove mineral spirits. However, 100° C. is not hot enough to activate the EXPANCEL. This leaves a material in which we can measure the extrudate (or unexpanded) properties. The following data was then taken:

Thickness=7 mils

Density=1.38 g/cc

Percent Compression at 100 PSI=0

Shore A Hardness=60

Thermal Conductivity at 10 PSI=0.83 W/m°C.

Thermal Conductivity at 100 PSI=1.53 W/m°C.

Figure 3:
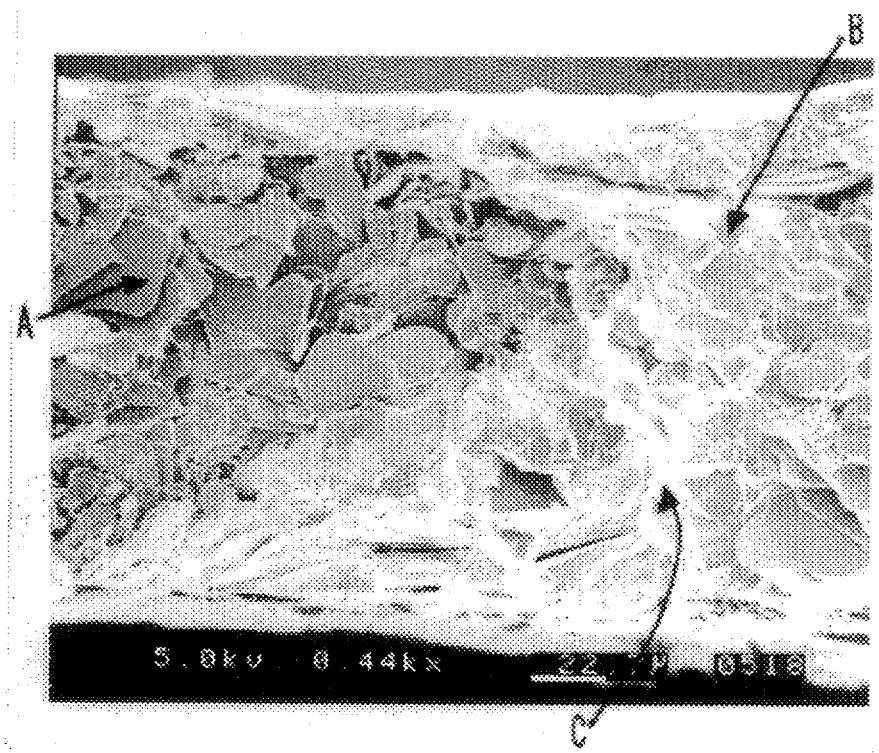
FIG. 3 is a scanning electron micrograph (SEM) of a cross-section of a cured extrudate (without expansion) in accordance with the teachings of the present invention, shown at 0.44k magnification.

As best seen by reference to FIG. 3, the cured extrudate comprises boron nitride flake at A; microspheres at B; and PTFE and silicone elastomer at C. [Note: In this particular SEM it is difficult to distinguish between the PTFE and the silicone elastomer.]

A separate piece of the extrudate material was then heated to 150° C. for 5 minutes. (See FIG. 4.) This type of heating causes the composite to expand (due to activation of the EXPANCEL) as the silicone elastomer cures and mineral spirits evaporate. The following data was then taken on this sample:

Thickness=17 mils

Density=0.53 g/cc→62% expansion

Percent of Compression at 100 PSI=31.3%

Shore A Hardness=18

Thermal Conductivity at 10 PSI=0.63 W/m°C.

Thermal Conductivity at 100 PSI=2.04 W/m°C.

Figure 4:
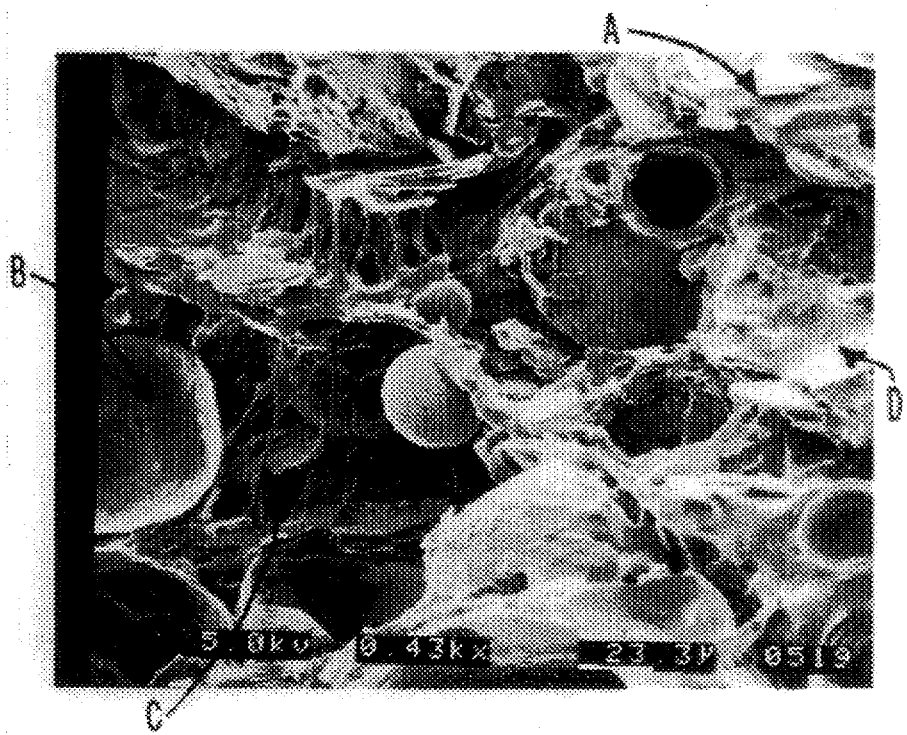
FIG. 4 is an SEM of a cross-section of an expanded thermally conductive article in accordance with the teachings of the present invention, shown at 0.43k magnification.

As best seen by reference to FIG. 4, the composite comprises boron nitride flake at A; microspheres at B; PTFE fibrils caused by the expansion process at C; and a silicone elastomer D.

The material of FIG. 4 has very novel properties as compared with the material of FIG. 3. First the material of FIG. 4 is 62% less dense then the material of FIG. 3, yielding a very soft and compressible material as noted by the Shore A durometer and compressibility. However, at 100 PSI, the thermal conductivity of the material of FIG. 4 is greater then the extrudate sample. This is quite surprising since this sample has much less boron nitride per unit volume. This is in sharp contrast to conventional percolation theory.

EXAMPLE 2

4.98 lbs. of Aluminum Nitride (type A500 FXWR obtained from ART, Inc.), and 87 g of EXPANCEL type 091DU microspheres was slurried in isopropyl alcohol and de-ionized water in a 10 gallon vessel. This slurry was then coagulated with 6.12 lbs. of PTFE dispersion (type TE3636 obtained from E. I. dupont de Nemours & Company, Inc.) at 22.5% solids. The resulting coagulum was dried at 95° C. for 24 hours. The coagulum was then frozen at −10° C. for 24 hours, and hand screened through a ¼ inch mesh metal screen. The resulting powder was then lubricated at a level of 0.25 lbs. lubricant per pound coagulum. The lubricant used comprised a mixture of 75% by weight silicone elastomer (Stygard® type 1-4105 obtained from Dow Corning, Inc.) and 25% by weight mineral spirits. The material was then re-frozen at −10° C. for 4 hours, and re-screened through the same ¼" screen. The resulting powder was left to dwell at room temperature (≈72° F.) for 24 hours, then preformed into a 2.5" diameter pellet. This pellet was then extruded into a tape approximately 150 mils thick and 4" wide. The tape was then calandered to 103 mils and heated to 150° C. for 5 minutes. This process yielded a porous PTFE composite with an interpenetrating cured silicone elastomer. The resulting composite had the following properties:

Thickness=167 mils

Density=0.91 g/cc

Percent Compression at 100 PSI=32.3%

Shore A Hardness=34

Thermal Resistance at 100 PSI=0.775° C./W

Thermal Conductivity at 100 PSI=2.1 W/m°C.

EXAMPLE 3

19.34 lbs. of silver flake (SILFLAKE 450 obtained from Technic Inc.), 3.91 lbs of silver coated aluminum powder (from Novamet Specialty Products Corp.), and 0.374 lbs. of EXPANCEL type 091DU microspheres were slurried with 54.7 liters of de-ionized water and 17.43 liters of isopropyl alcohol. The slurry was then coagulated with 17.33 lbs. of PTFE dispersion at 29.7% solids (type TE3636 from E. I. dupont de Nemours & Company, Inc.,) The resulting coagulum was then dried at 90° C. for 22 hours and frozen at −10° C. for 24 hours, then hand screened into powder form through a ¼ inch mesh screen. The material was then lubricated as in Example 2, at a level of 0.20 lbs. lubricant per pound coagulum. A tape was formed as in Example 2, except the tape was calendared to a thickness of 7 mils. A sample of this tape was heated to 130° C. for 4 minutes to cause expansion and curing. The following properties were measured:

Thickness=17 mils

Density=1.02 g/cc

Shore A Hardness=21

Percent Compression at 100 PSI=36.1

Electrical Resistivity at 100 PSI=0.008 Ω cm

Thermal Conductivity at 100 PSI=2.18 W/m°C.

In this example, a unique composite was created that is thermally conductive, while at the same time being soft and compressible.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

Having described the invention, what is claimed is:

1. A thermally conductive article comprising:

a polytetrafluoroethylene matrix;

thermally conductive particles;

expanded hollow polymeric particles; and an elastomer material interpenetrating said polytetrafluoroethylene matrix;

wherein said thermally conductive article has a thermal conductivity of greater than about 1.53 W/m°C. at 100 psi.

2. A thermally conductive article comprising:

a polytetrafluoroethylene matrix;

thermally conductive particles;

expanded hollow polymeric particles; and an elastomer material interpenetrating said polytetrafluoroethylene matrix;

wherein said thermally conductive article has a percent compression of greater than 30 percent at 100 psi and a thermal conductivity of greater than about 1.53 W/m°C. at psi.

3. An article comprising:

an electronic component;

a heat sink; and a thermally conductive article disposed between said electronic component and said heat sink, said thermally conductive article having a polytetrafluoroethylene matrix, thermally conductive particles, expanded hollow polymeric particles and an elastomer material interpenetrating the polytetrafluoroethylene matrix, wherein said thermally conductive article has a thermal conductivity of greater than about 1.53 W/m°C. at 100 psi.

4. The thermally conductive article of claims 1, 2 or 3, wherein the thermally conductive particles are selected from the group consisting of: metals; metal bead; metal powder; metal fiber; metal coated fiber; metal flake; metal coated metals; metal coated ceramics; metal coated glass bubbles; metal coated glass beads; metal coated mica flakes; zinc oxide; aluminum oxide; boron nitride; aluminum nitride; diamond powder; and silicon carbide.

5. The thermally conductive article of claims 1, 2 or 3, having a density of less than 1.5 g/cc.

6. The thermally conductive article of claims 1, 2 or 3, having a Shore A hardness of less than about 35.

7. The thermally conductive article of claims 1, 2 or 3, having a Shore A hardness of about 20.

8. The thermally conductive article of claims 1, 2 or 3, wherein the elastomer material is a silicone elastomer material.

9. The thermally conductive article of claims 1, 2, or 3, having a thermal conductivity of greater than about 2 W/m°C. at 100 psi.

10. The thermally conductive article of claims 1, 2 or 3, wherein the thermally conductive particles include a mixture of thermally conductive flakes and thermally conductive powder.

11. The thermally conductive article of claims 1, 2 or 3, wherein the interpenetrating elastomer material is selected from the group consisting of: polyurethane; ethylene/propylene; fluorosilicone; fluorocarbon elastomers; perfluoroelastomers; and fluoroelastomer materials.

* * * * *